(12) United States Patent
Hong

(10) Patent No.: US 12,176,240 B2
(45) Date of Patent: Dec. 24, 2024

(54) METHOD FOR MANUFACTURING SEMICONDUCTOR PACKAGE STRUCTURE AND CLAMP APPARATUS

(71) Applicant: Advanced Semiconductor Engineering, Inc., Kaohsiung (TW)

(72) Inventor: Yun Di Hong, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 917 days.

(21) Appl. No.: 17/086,187

(22) Filed: Oct. 30, 2020

(65) Prior Publication Data

US 2022/0139751 A1 May 5, 2022

(51) Int. Cl.
| | |
|---|---|
| *H01L 21/687* | (2006.01) |
| *H01L 21/304* | (2006.01) |
| *H01L 21/67* | (2006.01) |
| *H01L 21/683* | (2006.01) |

(52) U.S. Cl.
CPC .......... *H01L 21/687* (2013.01); *H01L 21/304* (2013.01); *H01L 21/67092* (2013.01); *H01L 21/6835* (2013.01); *H01L 2221/68354* (2013.01)

(58) Field of Classification Search
CPC .................. H01L 21/68721; H01L 21/687
See application file for complete search history.

(56) References Cited

U.S. PATENT DOCUMENTS

| | | | | |
|---|---|---|---|---|
| 5,883,522 | A * | 3/1999 | O'Boyle | ........... H01L 21/68721 269/21 |
| 2004/0110323 | A1 * | 6/2004 | Becker | ..................... H01L 24/19 257/E25.023 |
| 2006/0055073 | A1 * | 3/2006 | Fayaz | ............... H01L 21/67288 264/101 |
| 2020/0365422 | A1 * | 11/2020 | Amano | ..................... B05B 9/00 |

* cited by examiner

*Primary Examiner* — Xiaoming Liu
(74) *Attorney, Agent, or Firm* — FOLEY & LARDNER LLP

(57) ABSTRACT

A method for manufacturing a semiconductor package structure and a clamp apparatus are provided. The method includes: (a) providing a package body disposed on a chuck, wherein the package body includes at least one semiconductor element encapsulated in an encapsulant; (b) moving a pressing tool transversely to above the package body; and (c) pressing the package body on the chuck through the pressing tool.

19 Claims, 22 Drawing Sheets

METHOD FOR MANUFACTURING SEMICONDUCTOR PACKAGE STRUCTURE AND CLAMP APPARATUS

BACKGROUND

1. Field of the Disclosure

The present disclosure relates to a method for manufacturing a semiconductor package structure and a clamp apparatus, and to a method including pressing and sucking steps and a clamp apparatus for accomplishing the same.

2. Description of the Related Art

In order to reduce a thickness of a semiconductor package structure, a molded wafer that is in an intermediate state of fabrication is thinned. However, the molded wafer may include a semiconductor die and a molding compound covering the semiconductor die. The thinned molded wafer may have a severe warpage due to the CTE mismatch between the semiconductor die and the molding compound. When the warped molded wafer is disposed on a chuck for flattening, it is difficult to create a negative pressure or a vacuum between the chuck and the warped molded wafer because the distance between the chuck and the warped molded wafer is too large. That is, the warped molded wafer cannot be flattened by the chuck. In addition, the warped molded wafer may shift and vibrate during flattening. Thus, the following step may be difficult to be conducted to the warped and thinned molded wafer.

SUMMARY

In some embodiments, a method for manufacturing a semiconductor package structure includes: (a) providing a package body disposed on a chuck, wherein the package body includes at least one semiconductor element encapsulated in an encapsulant; (b) moving a pressing tool transversely to above the package body; and (c) pressing the package body on the chuck through the pressing tool.

In some embodiments, a clamp apparatus includes a chuck, a pressing tool and a first moving device. The chuck is configured to place a package body. The pressing tool is disposed on at least one outer side of the chuck. The at least one outer side of the chuck is outside an upper projection area of the chuck. The first moving device is configured to move the pressing tool transversely to above the package body.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
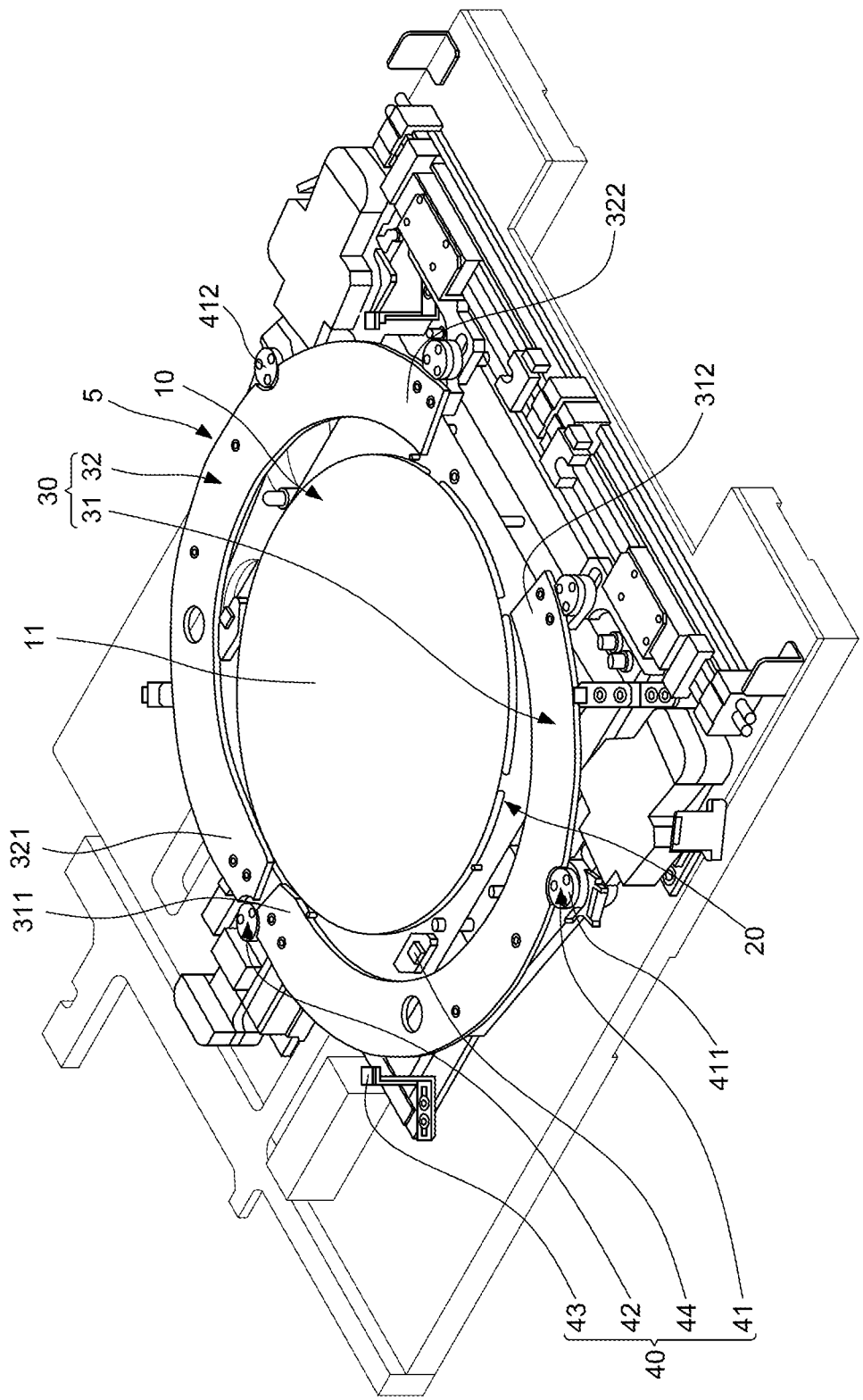
FIG. 1 illustrates a perspective view of one or more stages of an example of a method for manufacturing a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
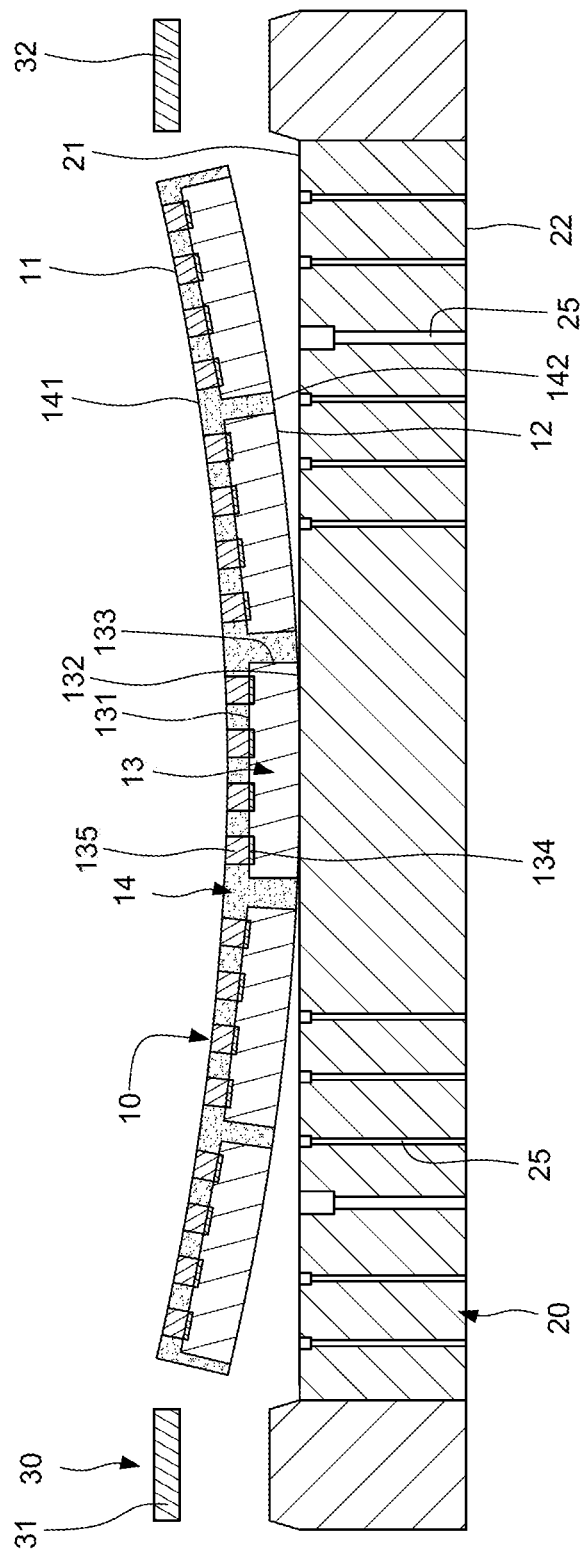
FIG. 2 illustrates a cross-sectional view of one or more stages of an example of a method for manufacturing a semiconductor package structure according to some embodiments of the present disclosure.

FIG. 1 through FIG. 20 illustrate a method for manufacturing a semiconductor package structure according to some embodiments of the present disclosure. Referring to FIG. 1 and FIG. 2, a package body 10 and a clamp apparatus 5 are provided. The clamp apparatus 5 may be configured to press and flatten the package body 10.

The package body 10 may be in a molded wafer type or in a molded panel type, and may have a top surface 11 and a bottom surface 12 opposite to the top surface 11. The package body 10 may include at least one semiconductor element 13, and an encapsulant 14. The at least one semiconductor element 13 may include a plurality of semiconductor dice 13 disposed side by side. The semiconductor element 13 has a top surface 131 (e.g., an active surface), a bottom surface 132 (e.g., a backside surface) and a lateral side surface 133. The second surface 132 is opposite to the top surface 131, and the lateral side surface 133 extends between the top surface 131 and the second surface 132. The second surface 132 of the semiconductor element 13 may be disposed adjacent to the chuck 20. In some embodiments, a distance between the top surface 11 of the package body 10 and the top surface 131 (i.e., the active surface) of the semiconductor element 13 may be less than a distance between the top surface 131 (i.e., the active surface) of the semiconductor element 13 and the bottom surface 12 of the package body 10. The semiconductor element 13 may include a plurality of conductive pads 134 and a plurality of conductive bumps 135. The conductive pads 134 may include copper, aluminum or gold, and may be disposed adjacent to or exposed from the top surface 131 of the semiconductor element 13. The conductive bumps 135 may be disposed on the conductive pads 134 and may protrude from the top surface 131 of the semiconductor element 13. In some embodiments, the conductive bump 135 may include copper (Cu), and may be in a pillar form.

The encapsulant 14 may be a cured molding compound with or without fillers. The encapsulant 14 may cover the top surface 131 of the semiconductor element 13, the lateral side surface 133 of the semiconductor element 13 and the conductive bumps 135 of the semiconductor element 13. Thus, the semiconductor element 13 is embedded or encapsulated in the encapsulant 14. The encapsulant 14 has a top surface 141 and a bottom surface 142 opposite to the top surface 141. In some embodiments, the top surface 141 of the encapsulant 14 may be ground, and the top surfaces of the conductive bumps 135 may be substantially coplanar with the top surface 141 of the encapsulant 14. Thus, the top surfaces of the conductive bumps 135 may be exposed from the top surface 141 of the encapsulant 14. The bottom surface 132 of the semiconductor element 13 may be substantially coplanar with the bottom surface 142 of the encapsulant 14, and they may be the bottom surface 12 of the package body 10.

The clamp apparatus 5 may include a chuck 20, a pressing tool 30 and a moving device 40. The package body 10 may be disposed on the chuck 20. In some embodiments, the bottom surface 12 of the package body 10 may be disposed adjacent to the chuck 20. The chuck 20 may be configured to place the package body 10. The chuck 20 has an upper surface 21 and a lower surface 22 opposite to the upper surface 21, and may include a plurality of suction holes 25 spaced apart from each other. The suction holes 25 may be recessed from the upper surface 21 and in communication with the upper surface 21 and the lower surface 22. In some embodiments, the suction holes 25 may be connected to a vacuum pump. Thus, a negative pressure (e.g., a pressure lower than 1 atm) may be created in the suction holes 25 through the vacuum pump, and the negative pressure may act on the package body 10 to suck and fix the package body 10.

The pressing tool 30 is disposed on at least one outer side of the chuck 20 and is configured to press and flatten the package body 10 on the chuck 20. In some embodiments, the at least one outer side of the chuck 20 may be outside an upper projection area of the chuck 20. A geometry of the pressing tool 30 may correspond to a geometry of the package body 10. In some embodiments, the pressing tool 30 may be in a rectangle shape or square shape. In some embodiments, the pressing tool 30 may be in a ring shape, for example, a round-ring shape or square-ring shape. In some embodiments, as shown in FIG. 1, the pressing tool 30 may include a first portion 31 and a second portion 32. The first portion 31 and the second portion 32 may be symmetrical in structure. In some embodiments, the first portion 31 and the second portion 32 may be in shape of an arc (e.g., a semicircle).

The first portion 31 has a first end 311 and a second end 312 opposite to the first end 311. The second portion 32 has a first end 321 and a second end 322 opposite to the first end 312. In some embodiments, the first end 321 of the second portion 32 may correspond to the first end 311 of the first portion 31 and may be disposed adjacent to the first end 311 of the first portion 31. The second end 322 of the second portion 32 may correspond to the second end 312 of the first portion 31, and a distance between the second end 322 of the second portion 32 and the second end 312 of the first portion 31 may be adjustable. In some embodiments, the first portion 31 and the second portion 32 may be rotatable. Thus, the first portion 31 and the second portion 32 may be rotated and combined to constitute a pressing ring (e.g., a pressing ring 30' of FIG. 10). In some embodiments, the first portion 31 and the second portion 32 may be combined into a pressing plate or a pressing disk.

Figure 3:
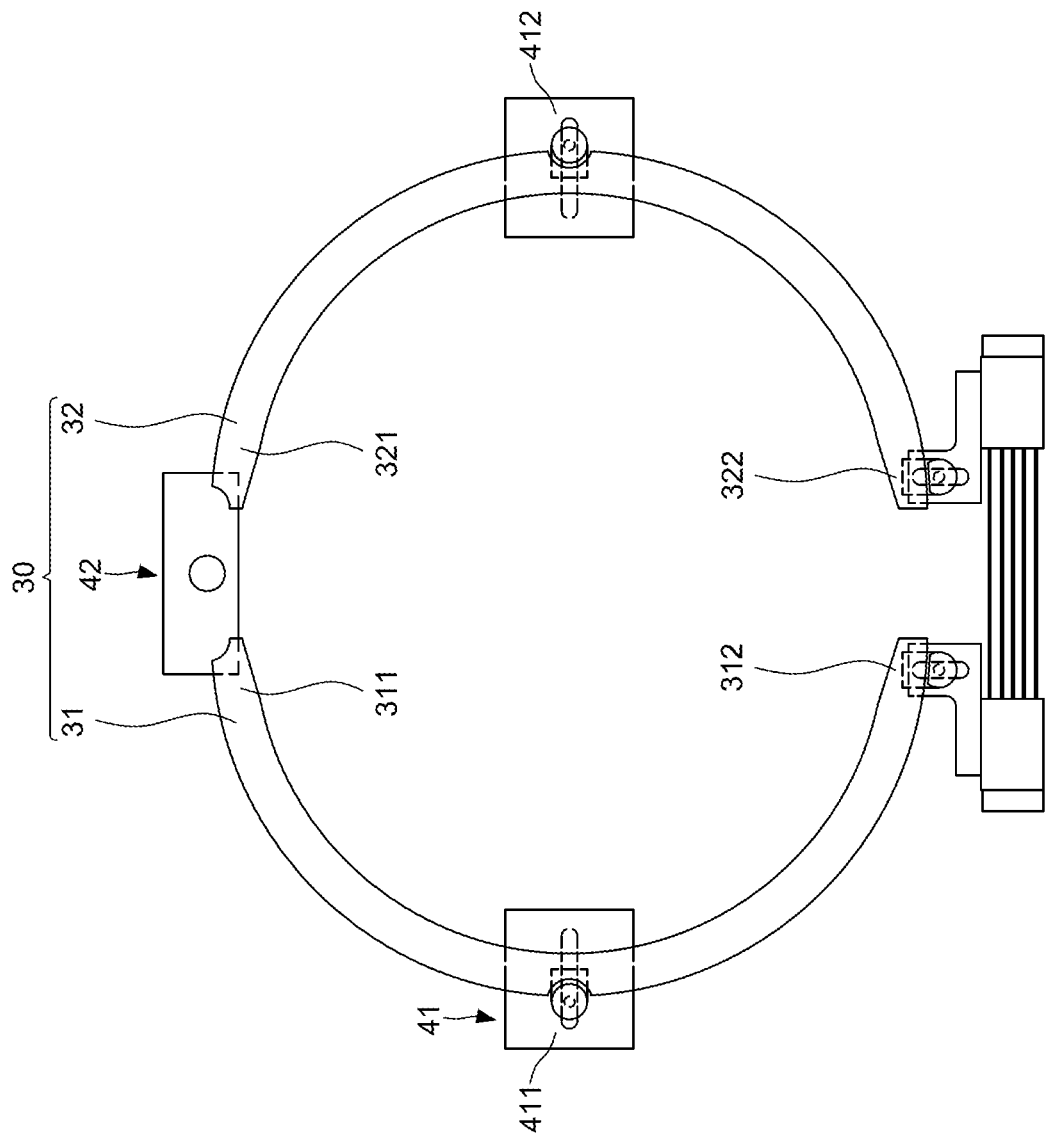
FIG. 3 illustrates an exploded top view of an example of a pressing tool according to some embodiments of the present disclosure.
Figure 4:
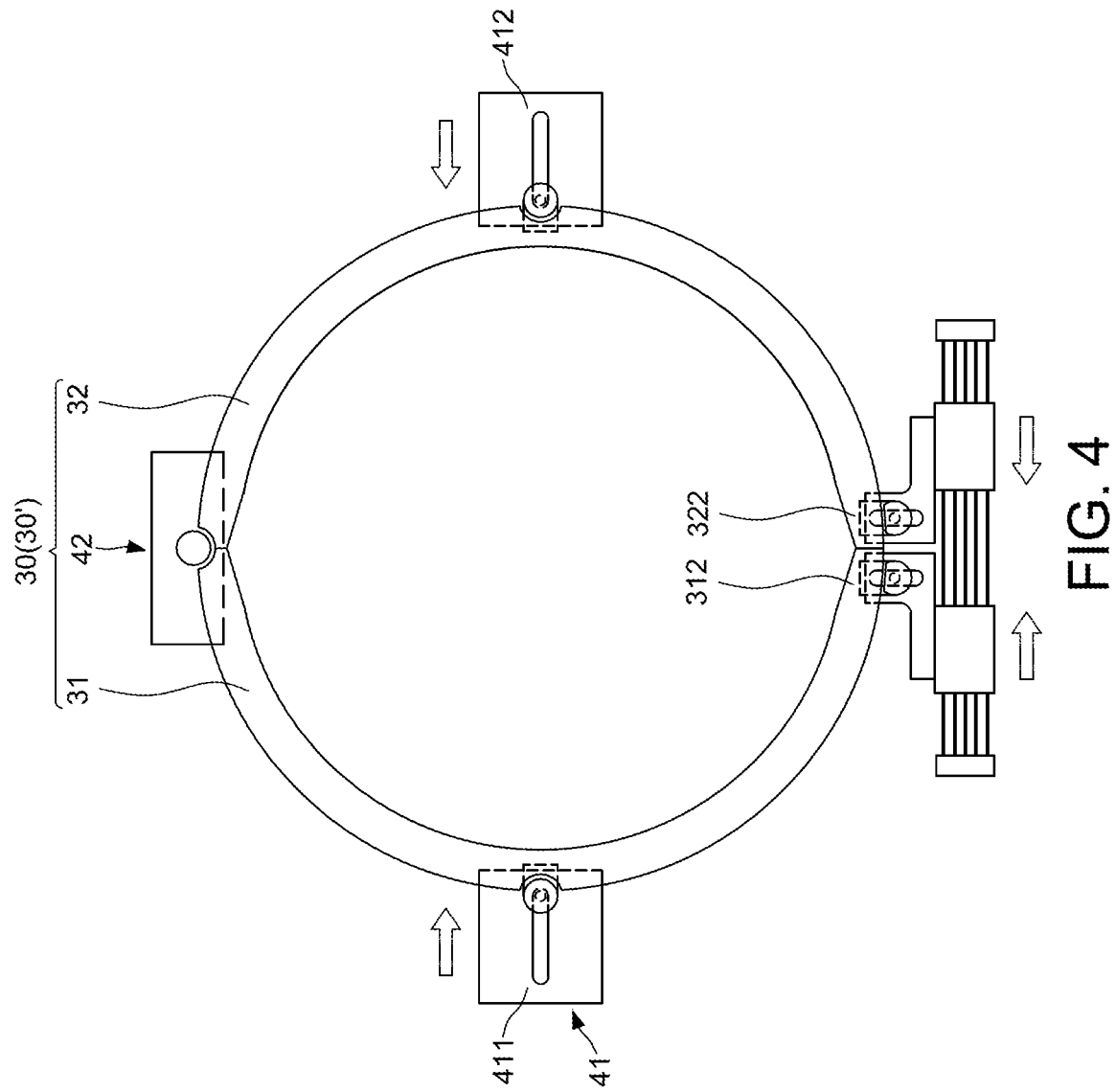
FIG. 4 illustrates an assembled top view of FIG. 3.

FIG. 3 illustrates an exploded top view of an example of a pressing tool 30 according to some embodiments of the present disclosure. FIG. 4 illustrates an assembled top view of FIG. 3. In some embodiments, as shown in FIG. 3 and FIG. 4, the first portion 31 and the second portion 32 of the pressing tool 30 may be movable horizontally. That is, the first portion 31 and the second portion 32 may be moved and combined horizontally to constitute the pressing ring 30'.

Figure 5:
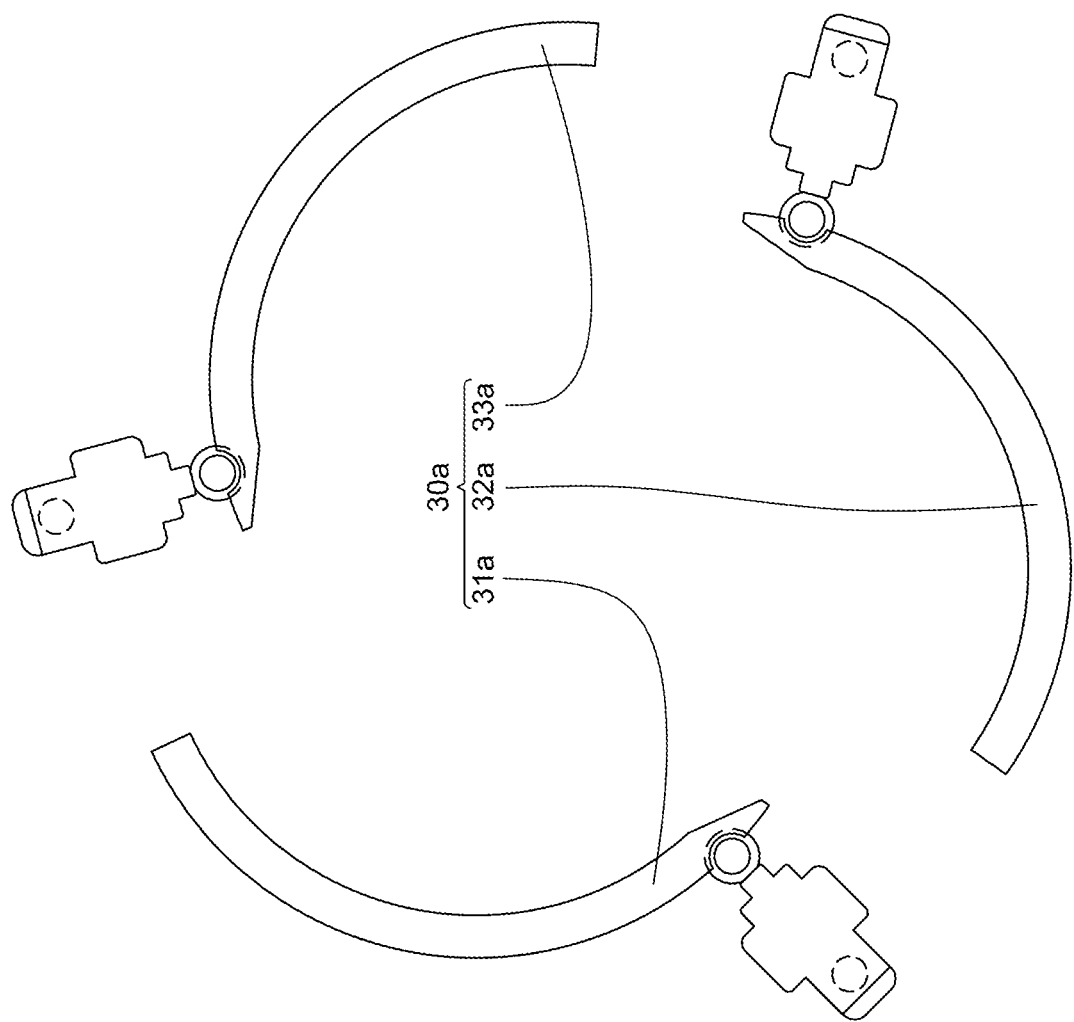
FIG. 5 illustrates an exploded top view of an example of a pressing tool according to some embodiments of the present disclosure.
Figure 6:
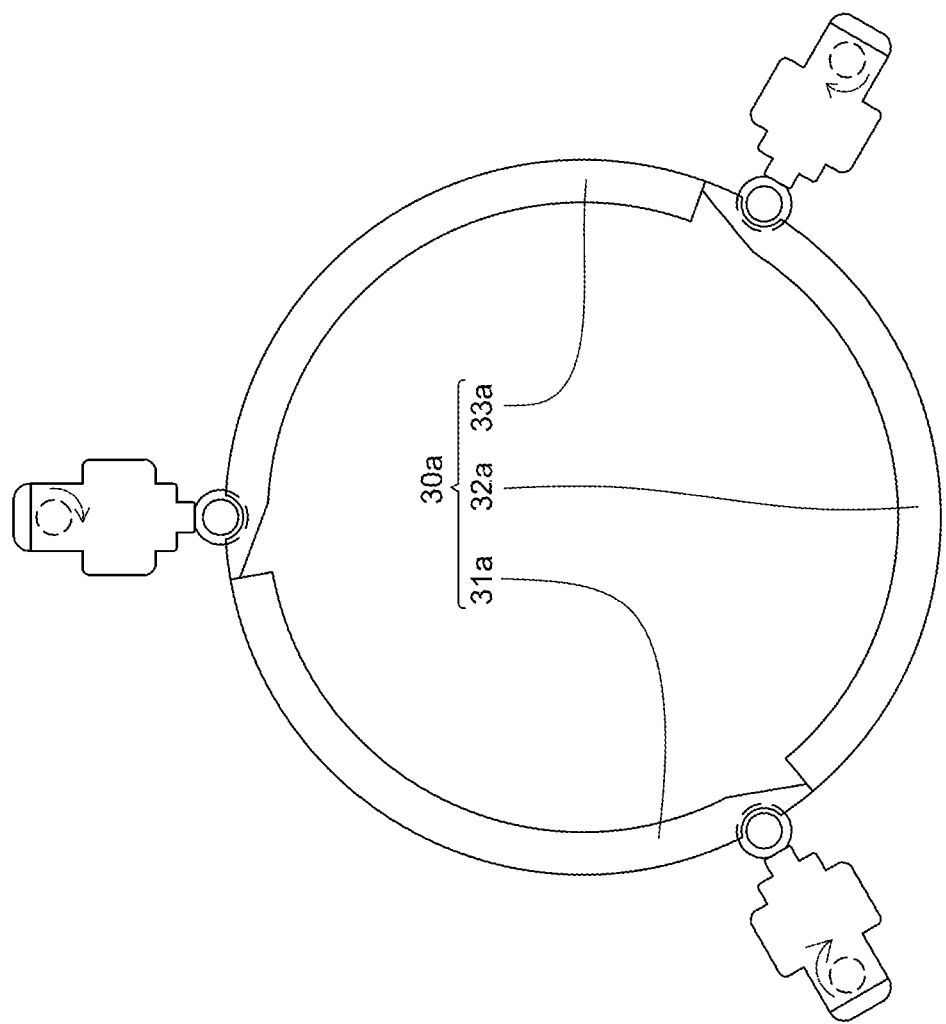
FIG. 6 illustrates an assembled top view of FIG. 5.

FIG. 5 illustrates an exploded top view of an example of a pressing tool 30a according to some embodiments of the present disclosure. FIG. 6 illustrates an assembled top view of FIG. 5. In some embodiments, as shown in FIG. 5 and FIG. 6, a pressing tool 30a may be provided. The pressing tool 30a may include a first portion 31a, a second portion 32a and a third portion 33a. The first portion 31a, the second portion 32a and the third portion 33a may be in shape of an arc (e.g., one-third circle). In addition, the first portion 31a, the second portion 32a and the third portion 33a may be rotatable. Thus, the first portion 31a, the second portion 32a and the third portion 33a may be rotated and combined to constitute a pressing ring.

Figure 7:
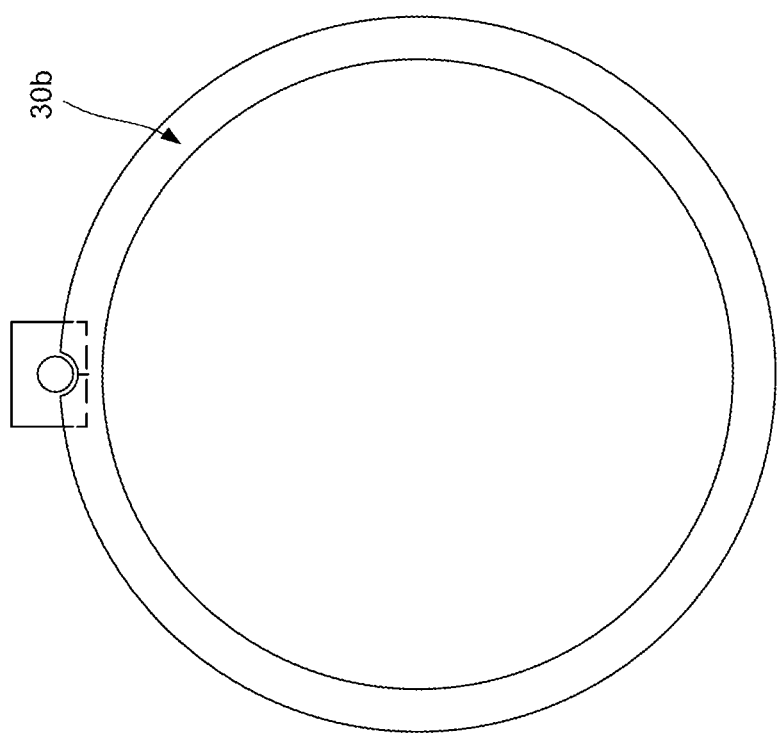
FIG. 7 illustrates a top view of an example of a pressing tool according to some embodiments of the present disclosure.

FIG. 7 illustrates a top view of an example of a pressing tool 30b according to some embodiments of the present disclosure. In some embodiments, as shown in FIG. 7, a pressing tool 30b may be provided. The pressing tool 30b may be one-piece tool and may be in shape of a ring.

Referring to FIG. 1, the moving device 40 is disposed around the chuck 20 and is configured to drive the pressing tool 30 or the chuck 20. In some embodiments, the moving device 40 may include a first moving device 41 and a second moving device 42. The first moving device 41 may be configured to move the pressing tool 30 transversely to above the package body 10. The second moving device 42 may be configured to adjust a distance between the chuck 20 and the pressing tool 30. In some embodiments, the second moving device 42 may drive the pressing tool 30 to move to the chuck 20. In some embodiments, the second moving device 42 may drive the chuck 20 to move to the pressing tool 30.

In some embodiments, as shown in FIG. 1, the first moving device 41 may include a first swing unit 411 and a second swing unit 412 opposite to the first swing unit 411. In some embodiments, the first portion 31 of the pressing tool 30 may be connected to the second moving device 42 and the first swing unit 411, and the second portion 32 of the pressing tool 30 may be connected to the second moving device 42 and the second swing unit 412. As shown in FIG. 1, the first end 311 of the first portion 31 and the first end 312 of the second portion 32 may be connected to the second moving device 42. The first swing unit 411 may be configured to drive the second end 312 of the first portion 31 to move to the second end 322 of the second portion 32, and the second swing unit 412 may be configured to drive the second end 322 of the second portion 32 to move to the second end 312 of the first portion 31.

When the first swing unit 411 swings the first portion 31 toward the second portion 32 and the second swing unit 412 swings the second portion 32 toward the first portion 31, the second end 312 of the first portion 31 and the second end 322 of the second portion 32 may rotate with the second moving device 42 as a center. Meanwhile, the distance between the second end 322 of the second portion 32 and the second end 312 of the first portion 31 may get smaller and smaller. Further, the first portion 31 and the second portion 32 may constitute a ring when the second end 312 of the first portion 31 and the second end 322 of the second portion 32 contact with each other.

In some embodiments, the moving device 40 may further include at least one first position sensor 43 and at least one second position sensor 44. The first position sensor 43 may be disposed at a side of the pressing tool 30 to detect a position of the pressing tool 30. The second position sensor 44 may be disposed at a side of the chuck 20 to detect a position of the chuck 20.

Figure 8:
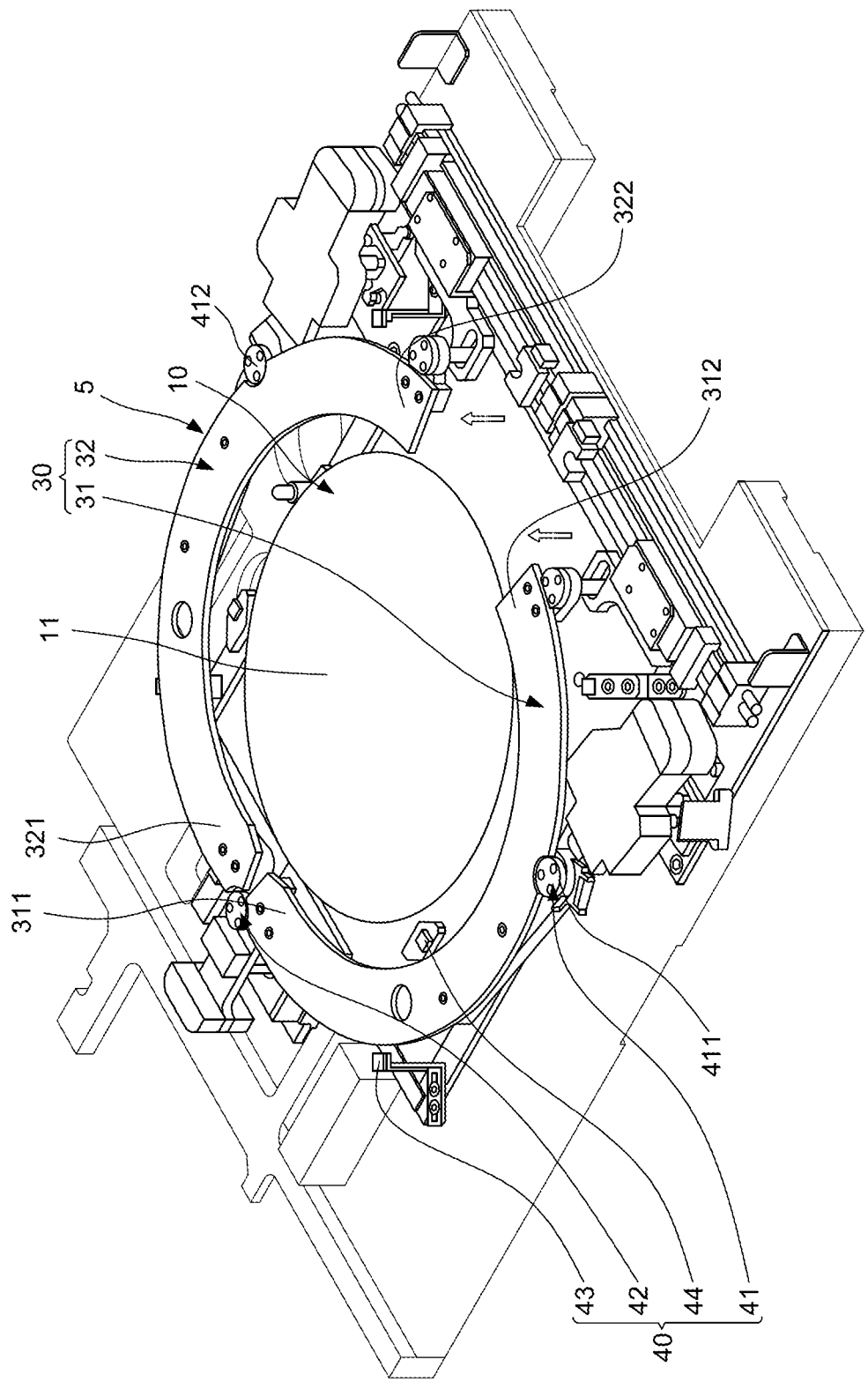
FIG. 8 illustrates a perspective view of one or more stages of an example of a method for manufacturing a semiconductor package structure according to some embodiments of the present disclosure.
Figure 9:
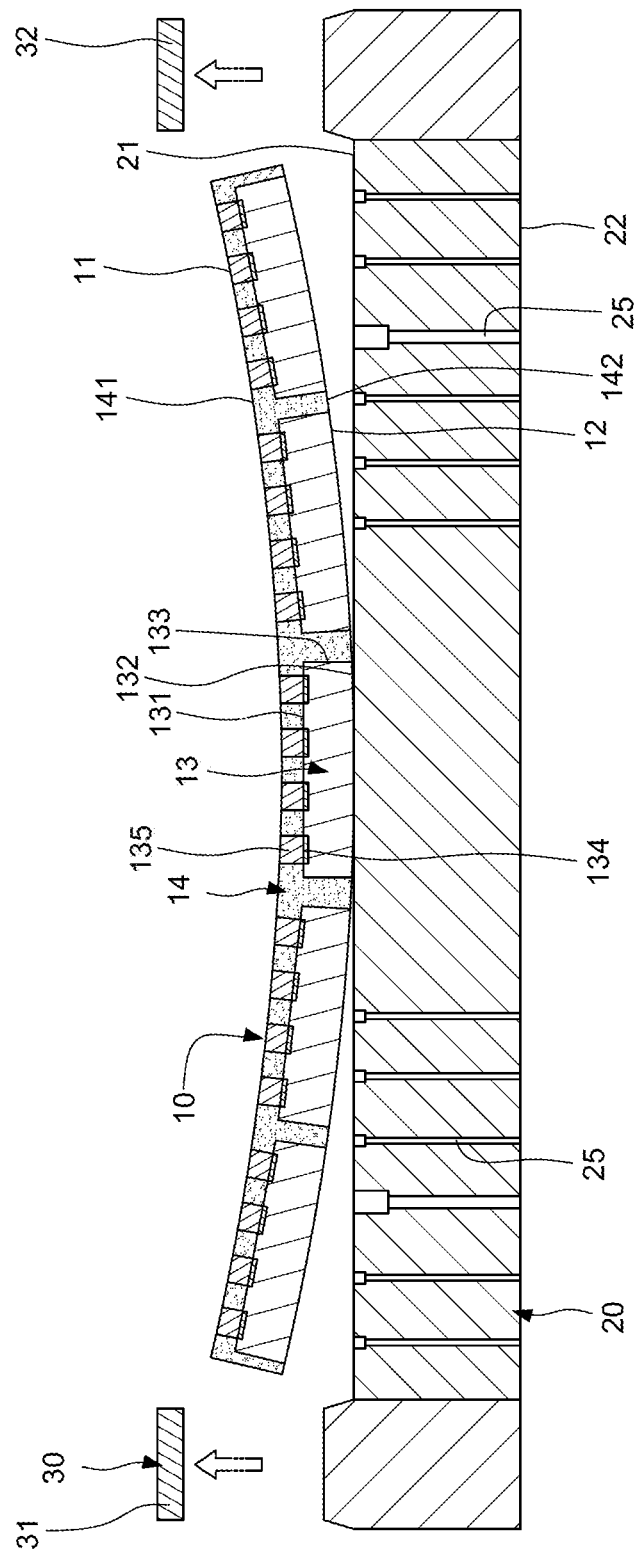
FIG. 9 illustrates a cross-sectional view of one or more stages of an example of a method for manufacturing a semiconductor package structure according to some embodiments of the present disclosure.

Referring to FIG. 8 through FIG. 11, the pressing tool 30 (including, for example, the first portion 31 and the second portion 32) is moved transversely to above the package body 10 through the moving device 40. Referring to FIG. 8 and FIG. 9, the first portion 31 and the second portion 32 of the pressing tool 30 may be moved upward through the second moving device 42. In some embodiments, the pressing tool 30 (including, for example, the first portion 31 and the second portion 32) may be higher than the package body 10.

Figure 10:
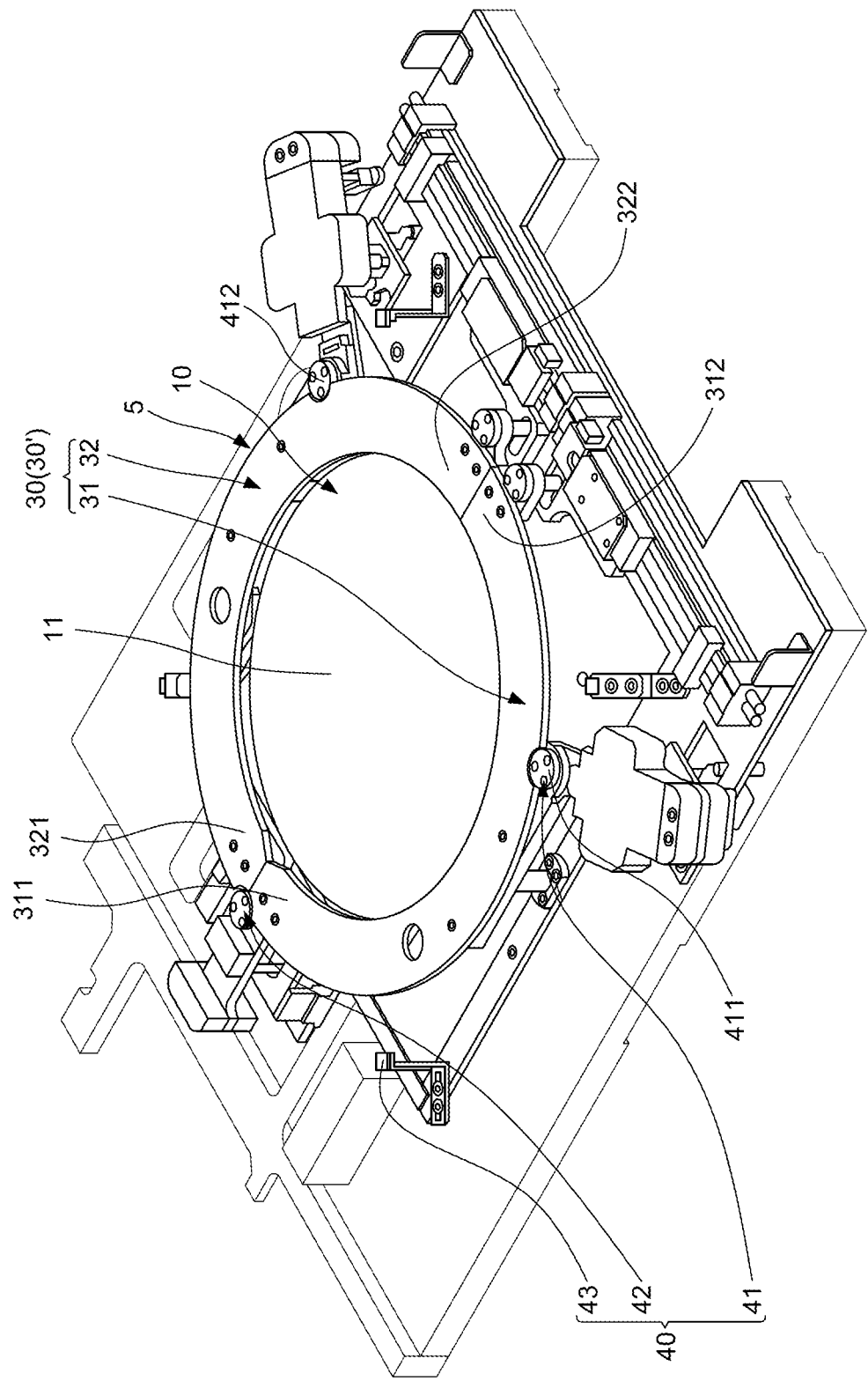
FIG. 10 illustrates a perspective view of one or more stages of an example of a method for manufacturing a semiconductor package structure according to some embodiments of the present disclosure.
Figure 11:
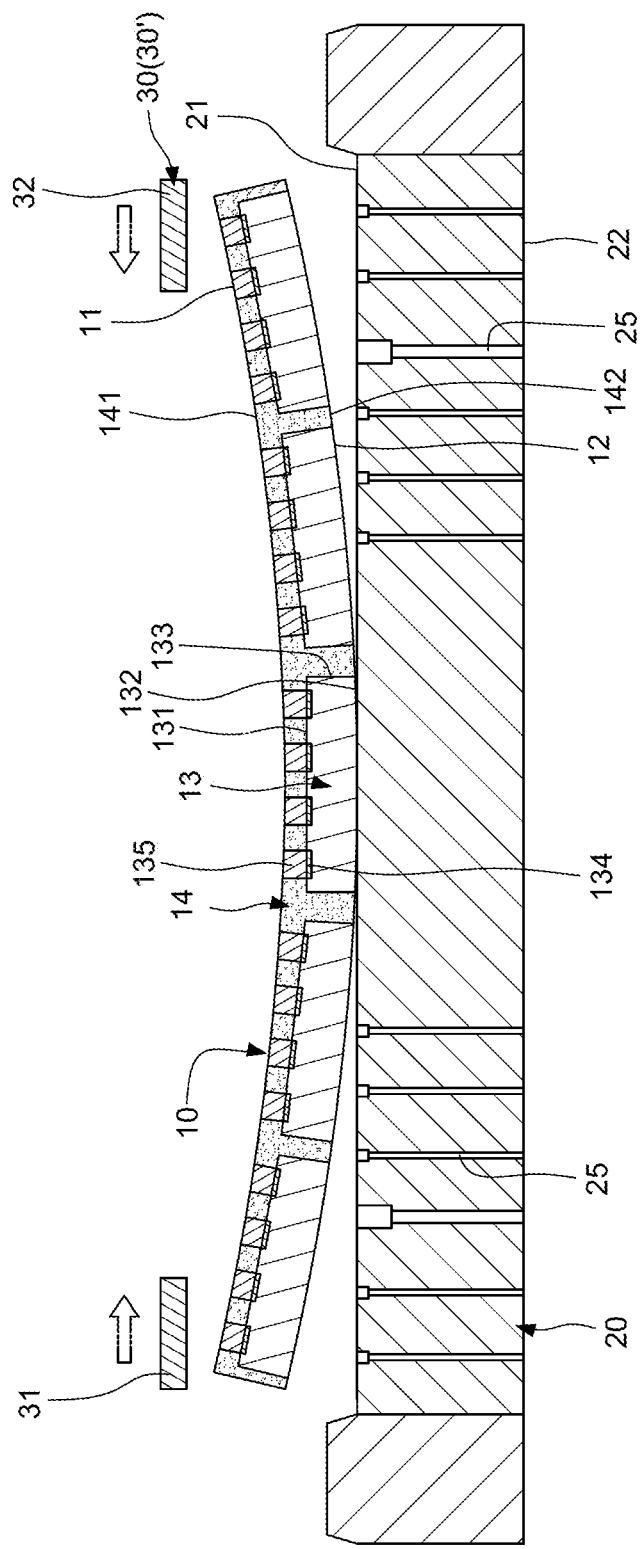
FIG. 11 illustrates a cross-sectional view of one or more stages of an example of a method for manufacturing a semiconductor package structure according to some embodiments of the present disclosure.

Referring to FIG. 10 through FIG. 11, the first portion 31 and the second portion 32 of the pressing tool 30 are rotated and combined through the first swing unit 411 and the second swing unit 412 of the first moving device 41 to constitute a pressing ring 30'. As shown in FIG. 10, a rotating direction of the first portion 31 may be contrary to a rotating direction of the second portion 32. In addition, as shown in FIG. 11, the first portion 31 and the second portion 32 may be moved transversely to above the package body 10 from two different sides corresponding to two different sides of the chuck 20. In some embodiments, a moving direction of the pressing tool 30 (including, for example, the first portion 31 and the second portion 32) may be parallel to the upper surface 21 of the chuck 20. Further, the pressing tool 30 (including, for example, the first portion 31 and the second portion 32) may correspond to a periphery of the package body 10. In addition, the periphery of the package body 10 may be a periphery of the top surface 11 of the package body 10.

Figure 12:
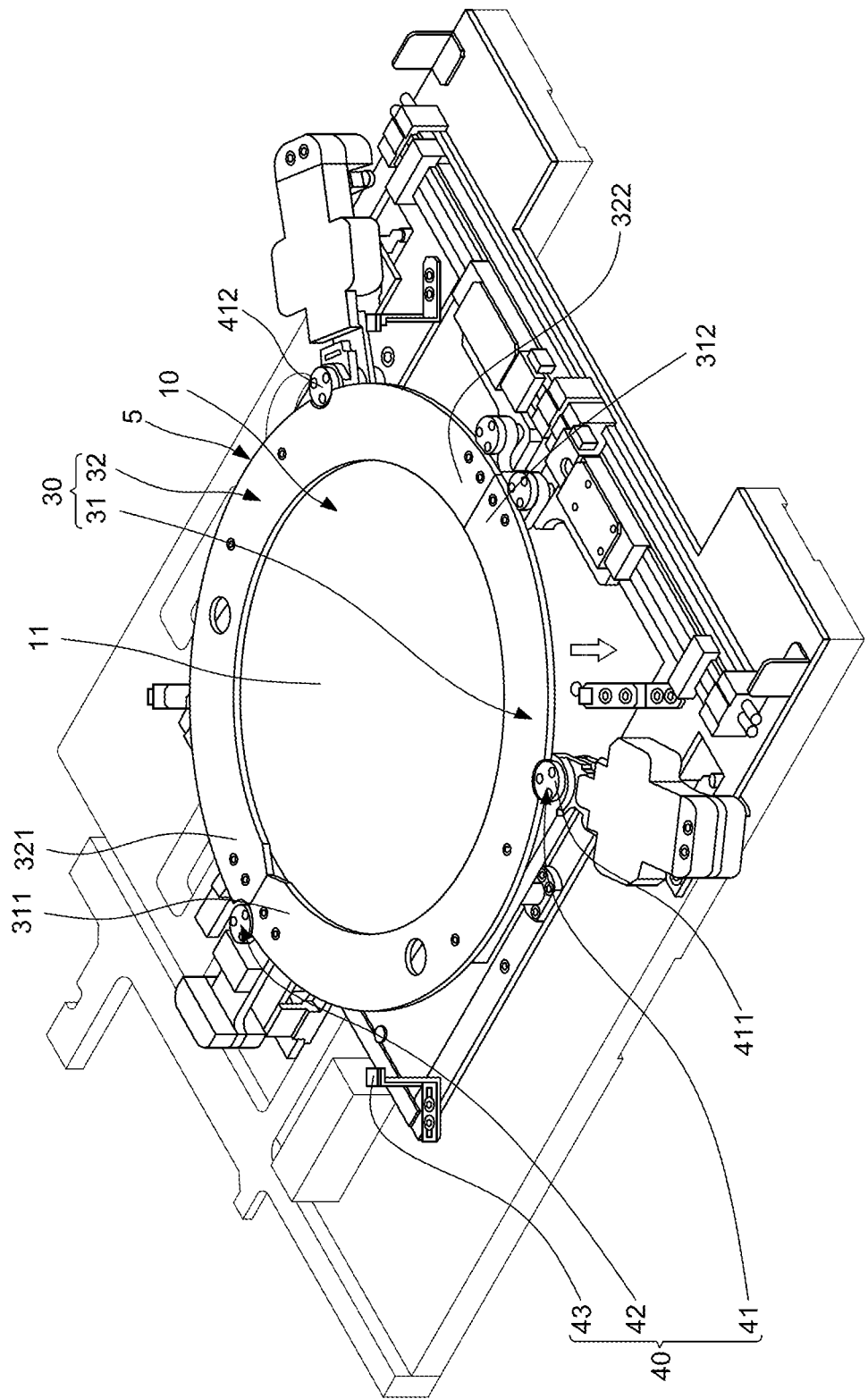
FIG. 12 illustrates a perspective view of one or more stages of an example of a method for manufacturing a semiconductor package structure according to some embodiments of the present disclosure.
Figure 13:
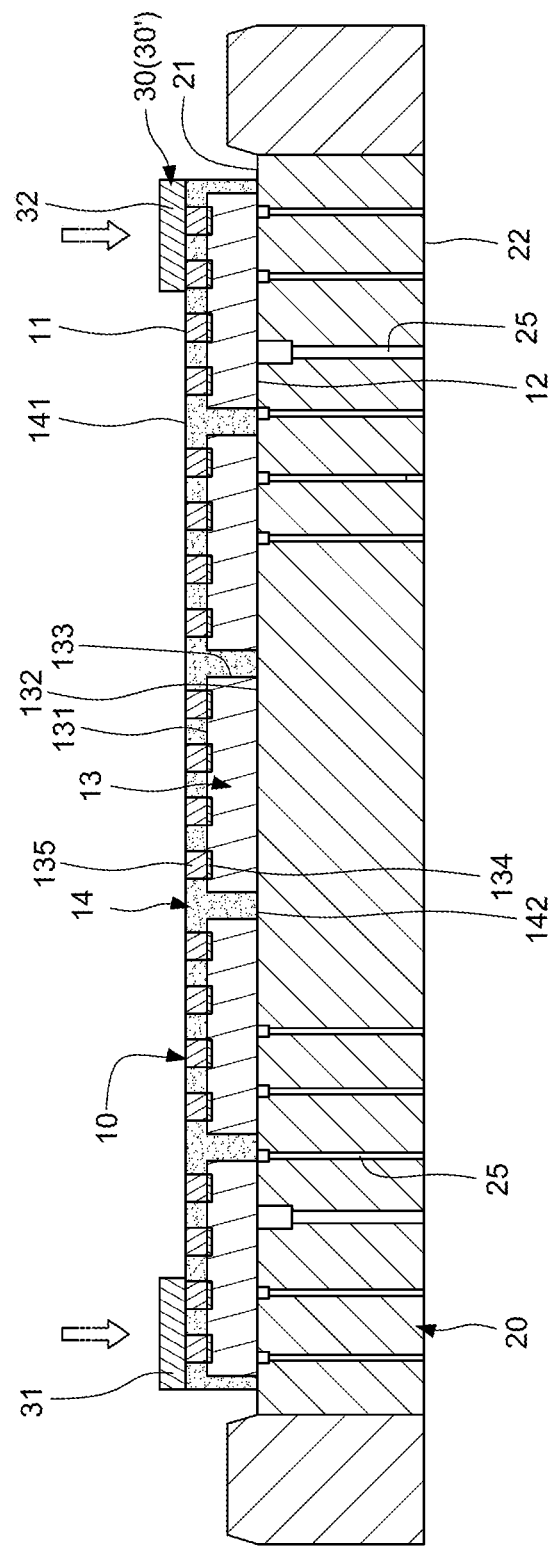
FIG. 13 illustrates a cross-sectional view of one or more stages of an example of a method for manufacturing a semiconductor package structure according to some embodiments of the present disclosure.

Referring to FIG. 12 through FIG. 13, the package body 10 is pressed and flattened on the chuck 20 through the pressing tool 30 (i.e., the pressing ring 30'). In some embodiments, the pressing tool 30 (i.e., the pressing ring 30') may be moved downward to press and flatten the package body 10 on the chuck 20 through the second moving device 42 of the moving device 40. As shown in FIG. 13, the pressing tool 30 (i.e., the pressing ring 30') may press the periphery of the package body 10 (e.g., the periphery of the top surface 11 of the package body 10).

In some embodiments, the pressing tool 30a of FIG. 5 through FIG. 6 and the pressing tool 30b of FIG. 7 may also be conducted to press and flatten the package body 10. When the pressing tool 30b of FIG. 7 is conducted to press and flatten the package body 10, the pressing tool 30b may be moved transversely to above the package body 10 from at least one outer side of the chuck 20. In some embodiments, the at least one outer side of the chuck 20 may be outside an upper projection area of the chuck 20. In some embodiments, the pressing tool 30b may be moved horizontally to above the package body 10. In some embodiments, the pressing tool 30b may be rotated to above the package body 10.

Figure 14:
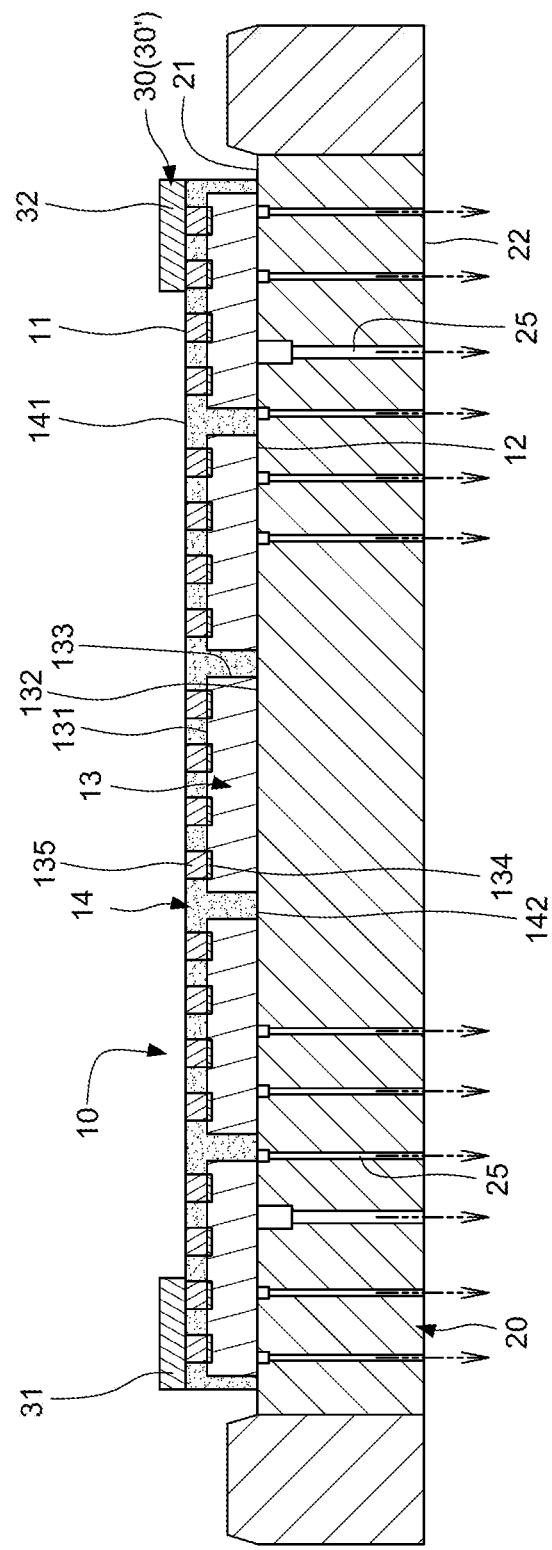
FIG. 14 illustrates a cross-sectional view of one or more stages of an example of a method for manufacturing a semiconductor package structure according to some embodiments of the present disclosure.

Referring to FIG. 14, the package body 10 is held on the chuck 20. In some embodiments, the package body 10 may be sucked through the suction holes 25 of the chuck 20 to create a negative pressure. That is, a pressure inside each of the suction holes 25 of the chuck 20 may be lower than 1 atm.

As shown in the embodiment illustrated in FIG. 14, the package body 10 is pressed and flattened through the pressing tool 30 (i.e., the pressing ring 30'). Thus, the chuck 20 may suck and fix the package body 10 without shift and vibration. Accordingly, the following step may be easily to be conducted to the package body 10.

Figure 15:
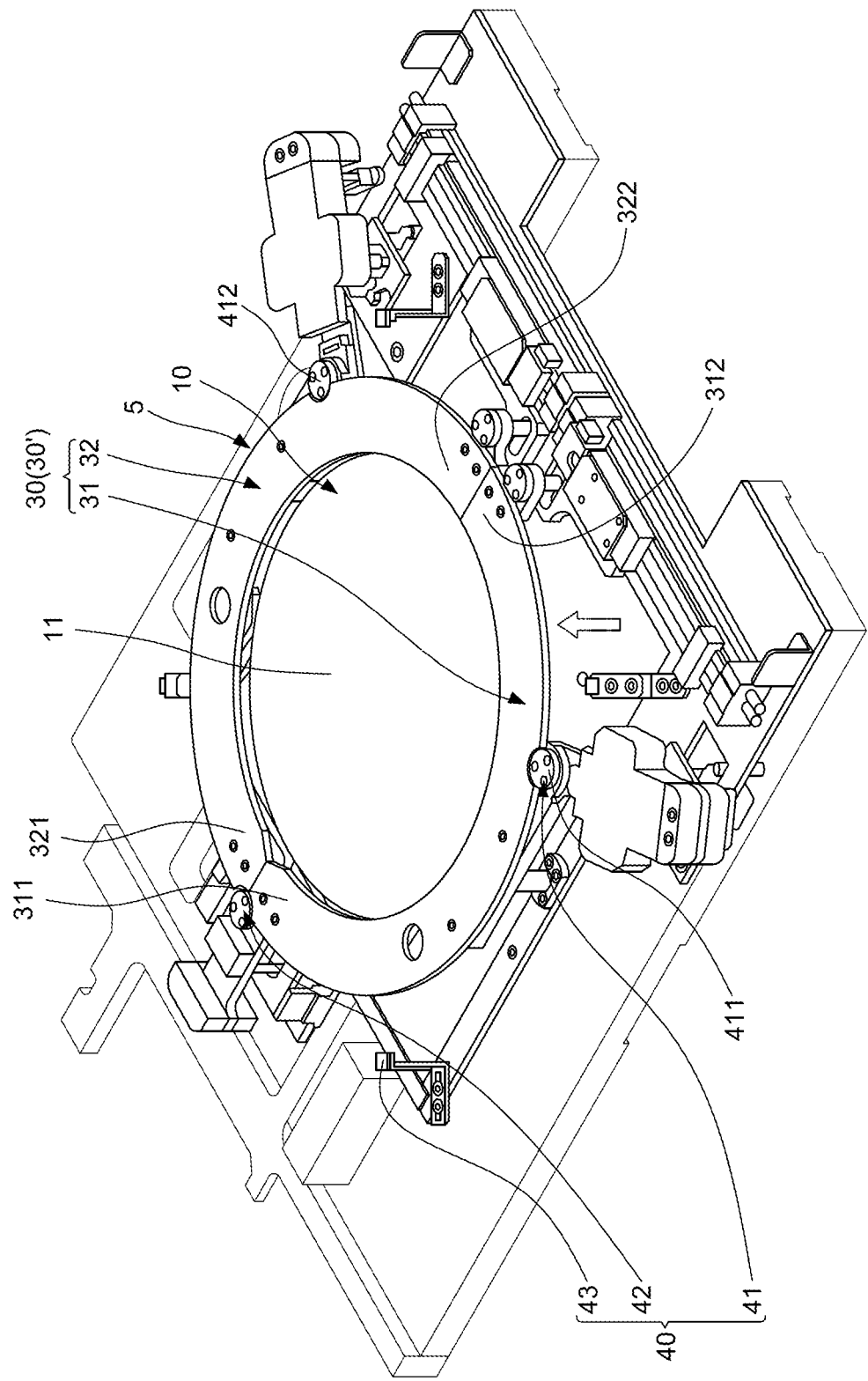
FIG. 15 illustrates a perspective view of one or more stages of an example of a method for manufacturing a semiconductor package structure according to some embodiments of the present disclosure.
Figure 16:
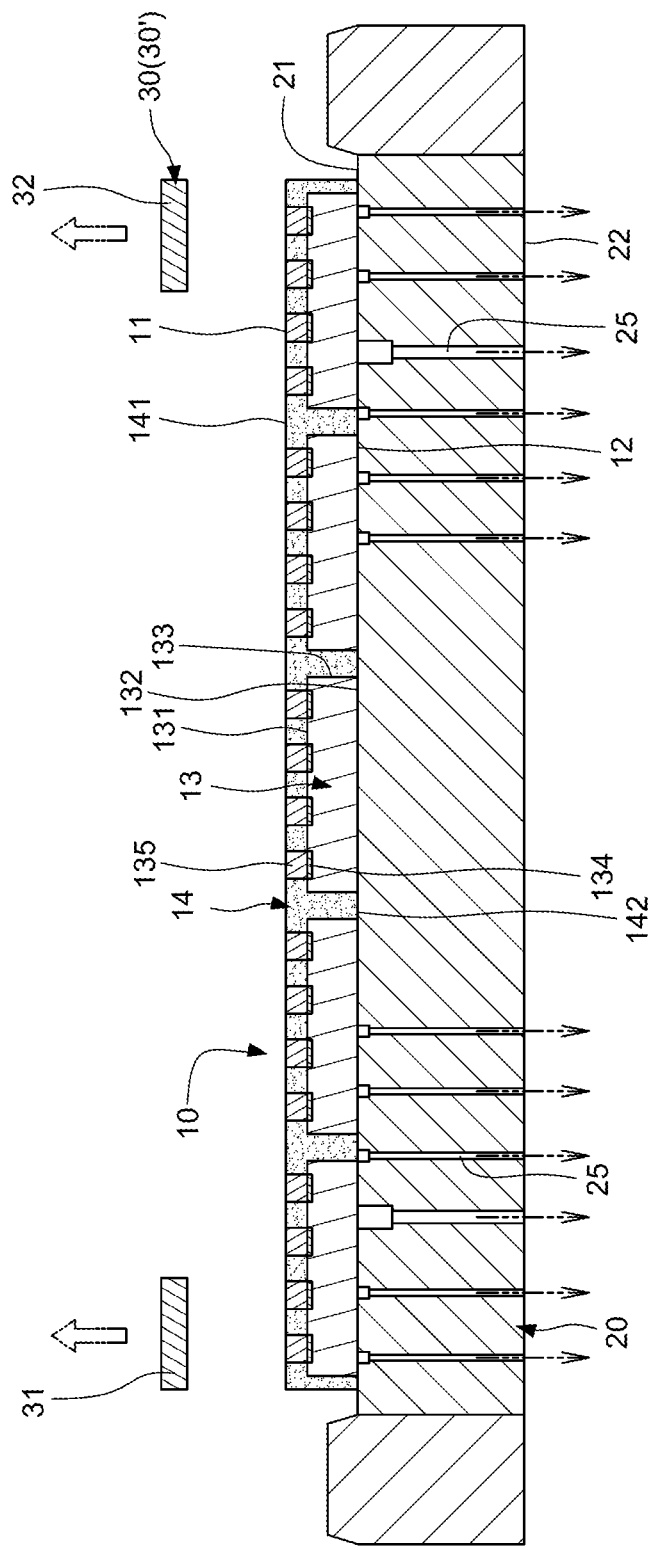
FIG. 16 illustrates a cross-sectional view of one or more stages of an example of a method for manufacturing a semiconductor package structure according to some embodiments of the present disclosure.
Figure 17:
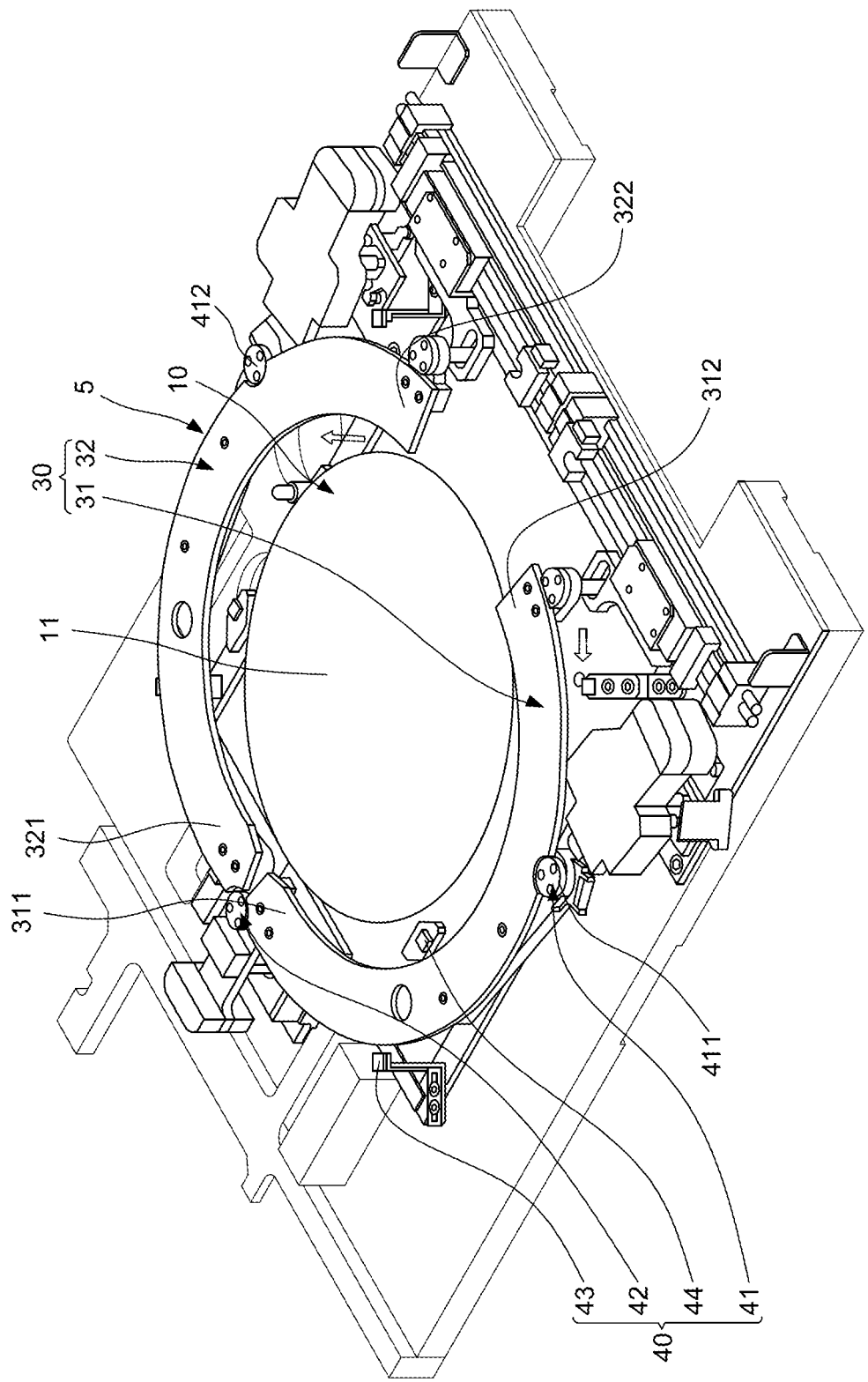
FIG. 17 illustrates a perspective view of one or more stages of an example of a method for manufacturing a semiconductor package structure according to some embodiments of the present disclosure.
Figure 18:
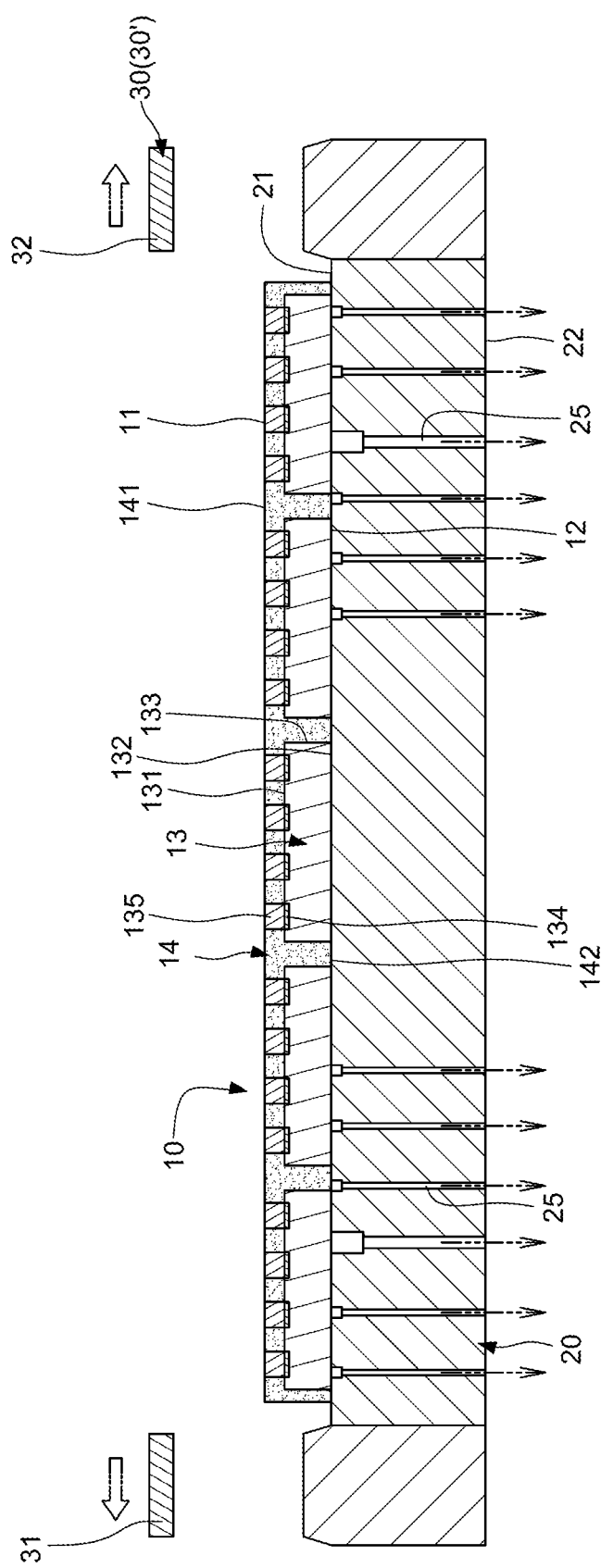
FIG. 18 illustrates a cross-sectional view of one or more stages of an example of a method for manufacturing a semiconductor package structure according to some embodiments of the present disclosure.

Referring to FIG. 15 through FIG. 18, the pressing tool 30 (i.e., the pressing ring 30') is removed from the package body 10. In some embodiments, as shown in FIG. 15 and FIG. 16, the pressing tool 30 (i.e., the pressing ring 30') may be moved upward to above the package body 10 through the second moving device 42 of the moving device 40. Then, as shown in FIG. 17 and FIG. 18, the pressing tool 30 (including, for example, the first portion 31 and the second portion 32) may be moved transversely from above the package body 10 through the first swing unit 411 and the second swing unit 412 of the first moving device 41. As shown in FIG. 18, the first portion 31 and the second portion 32 may be moved transversely to two different sides above the chuck 20. Then, the first portion 31 and the second portion 32 may be moved downward to positions as shown in FIG. 1 through the second moving device 42 of the moving device 40.

Figure 19:
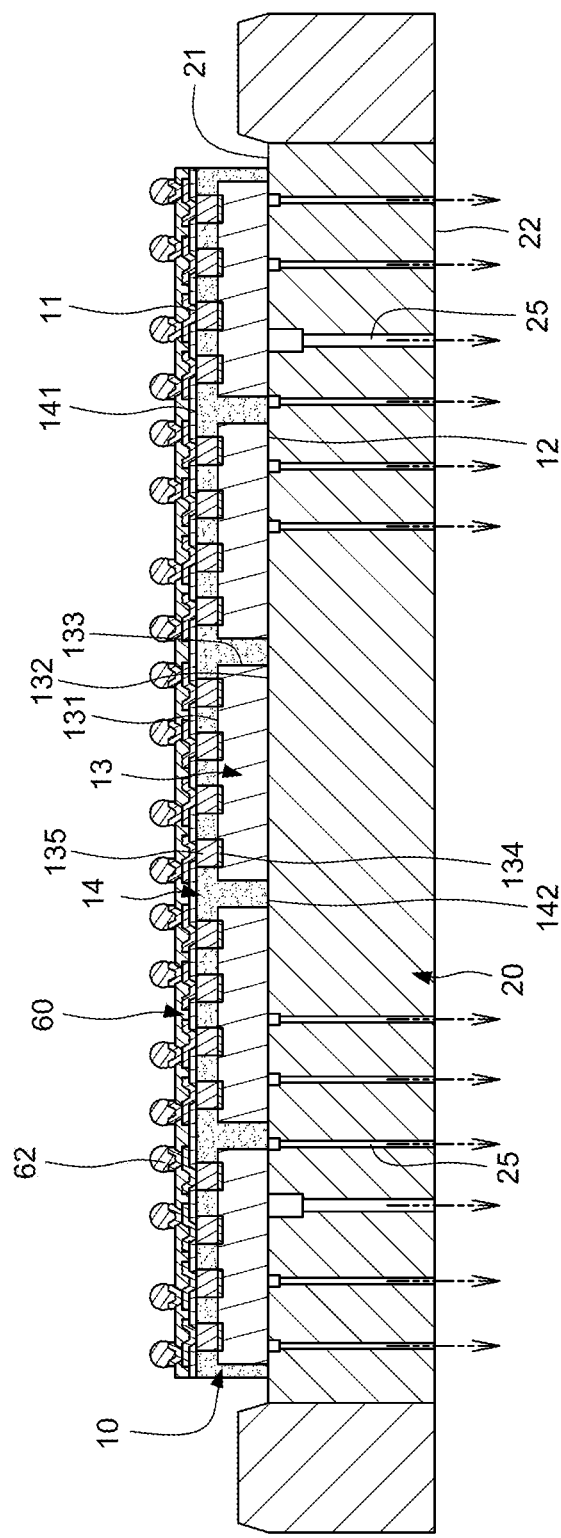
FIG. 19 illustrates a cross-sectional view of one or more stages of an example of a method for manufacturing a semiconductor package structure according to some embodiments of the present disclosure.

Referring to FIG. 19, a redistribution structure 60 may be formed on the package body 10. That is, at least one exposure step, at least one development step and at least one plating step may be performed on the package body 10 to form the redistribution structure 60. In some embodiments, a plurality of external connectors (e.g., solder balls) 62 may be formed on and electrically connected to the redistribution structure 60 for external connection.

Figure 20:
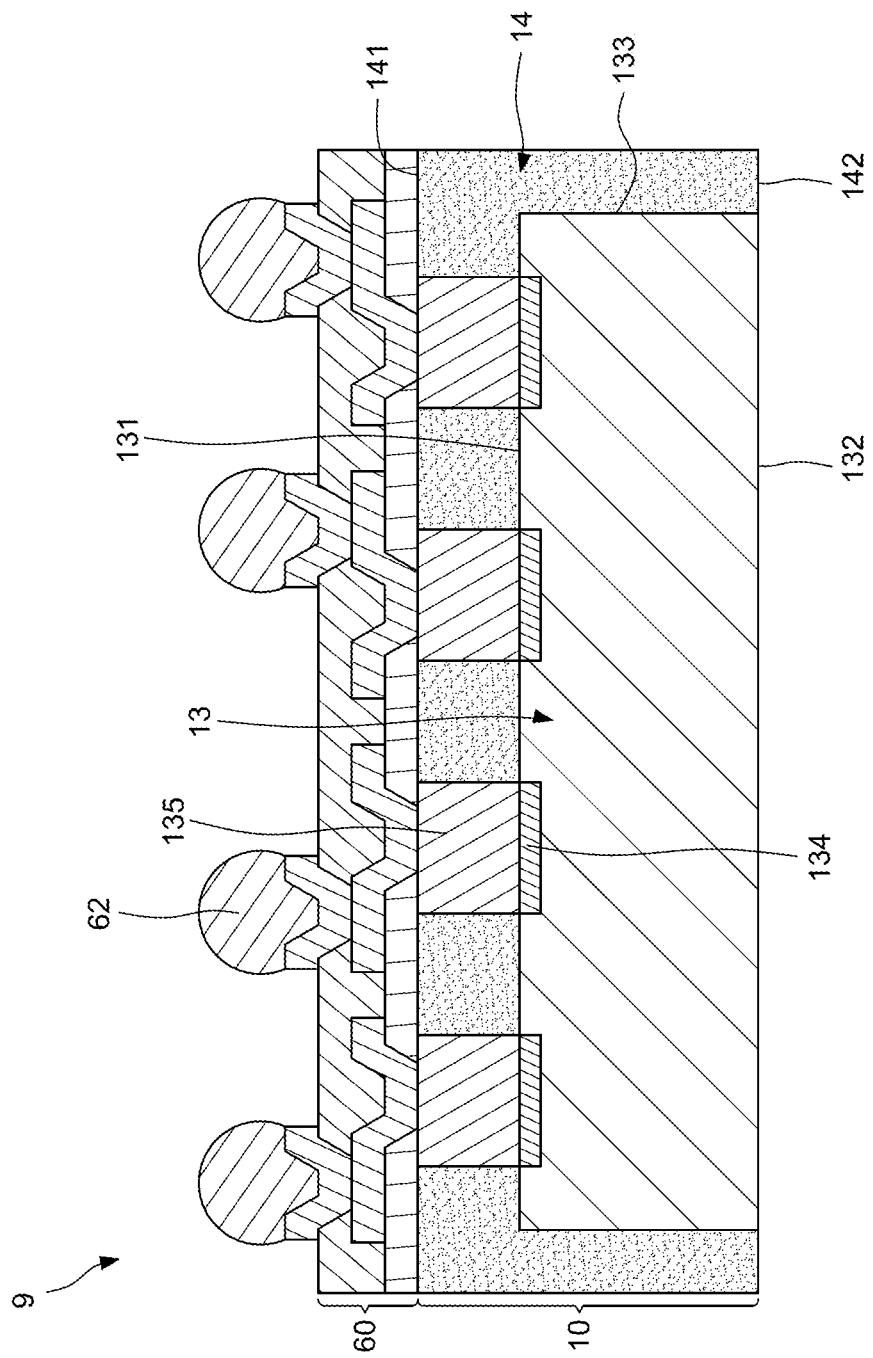
FIG. 20 illustrates a cross-sectional view of one or more stages of an example of a method for manufacturing a semiconductor package structure according to some embodiments of the present disclosure.

Referring to FIG. 20, the package body 10 and the redistribution structure 60 may be sawed or singulated to form a plurality of semiconductor package structures 9.

In some embodiments, the stages illustrated in FIG. 15 through FIG. 18 may be performed after the stage illustrated in FIG. 19. That is, the stage illustrated in FIG. 19 may be performed directly after the stage illustrated in FIG. 14.

Figure 21:
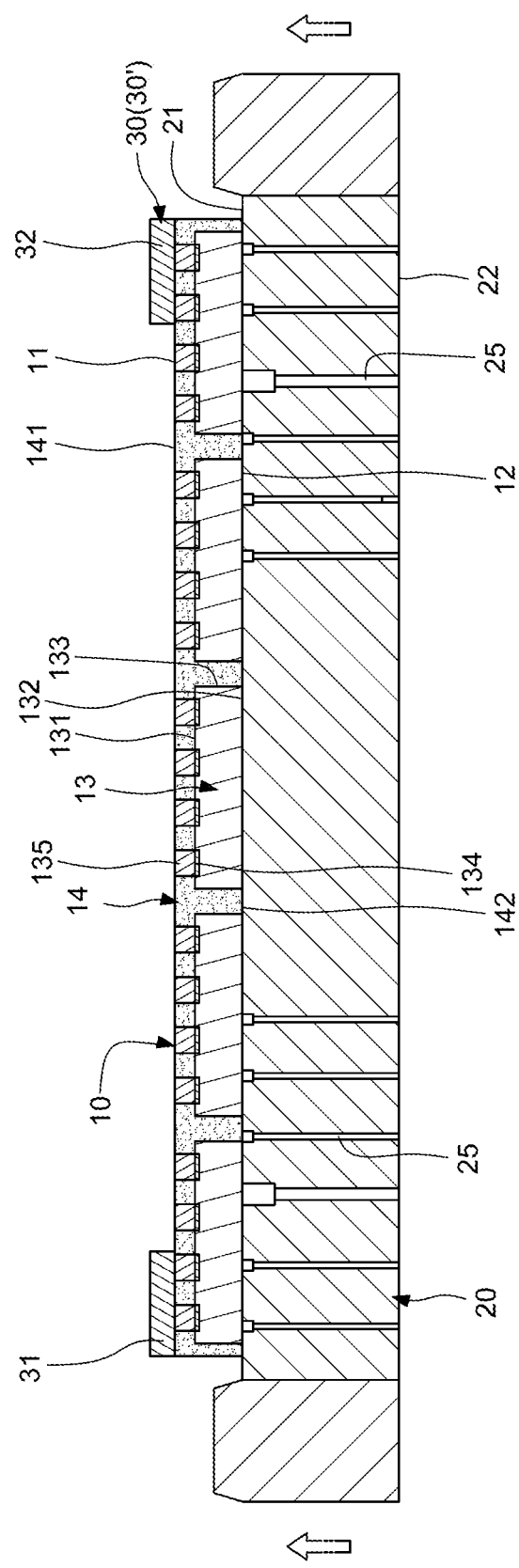
FIG. 21 illustrates a cross-sectional view of one or more stages of an example of a method for manufacturing a semiconductor package structure according to some embodiments of the present disclosure.
Figure 22:
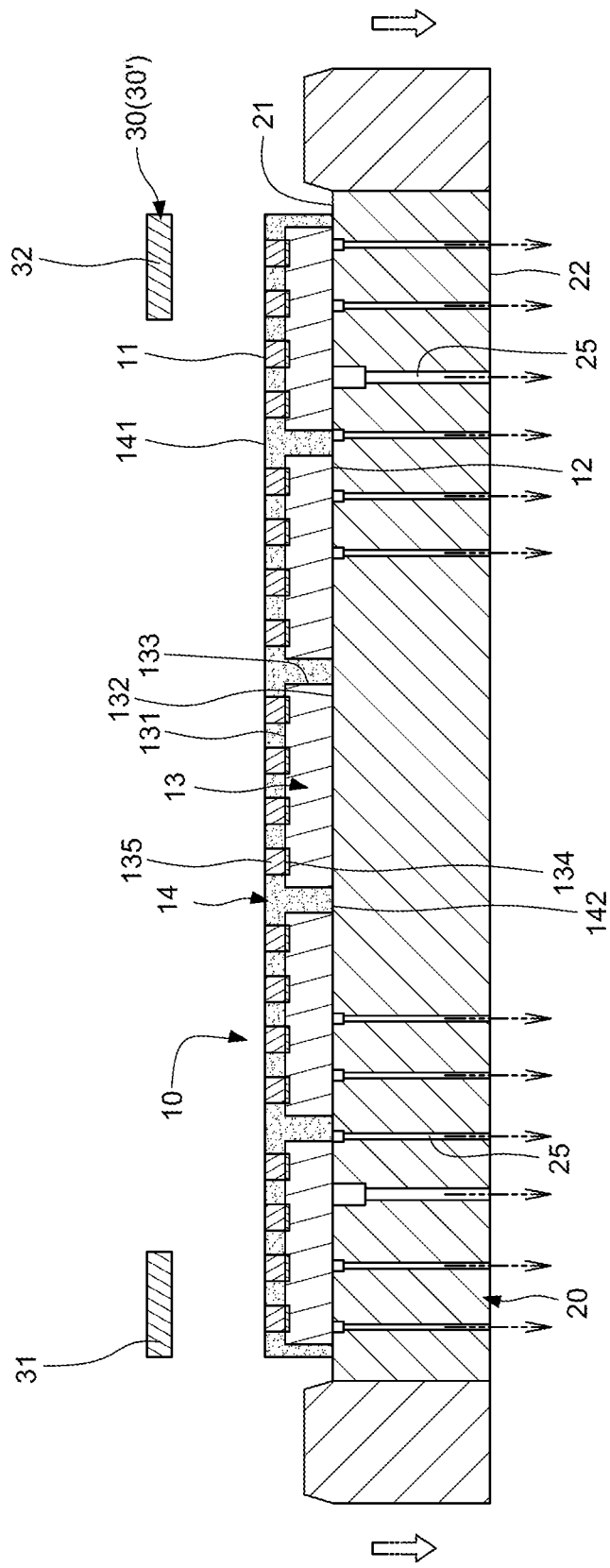
FIG. 22 illustrates a cross-sectional view of one or more stages of an example of a method for manufacturing a semiconductor package structure according to some embodiments of the present disclosure.

FIG. 21 and FIG. 22 illustrate a method for manufacturing a semiconductor package structure according to some embodiments of the present disclosure. In some embodiments, the method is for manufacturing the semiconductor package structure 9 shown in FIG. 20. The initial several stages of the illustrated process are the same as, or similar to, the stages illustrated in FIG. 1 through FIG. 11. FIG. 21 depicts a stage subsequent to that depicted in FIG. 10 through FIG. 11. FIG. 22 depicts a stage subsequent to that depicted in FIG. 14.

Referring to FIG. 21, the package body 10 is pressed and flattened on the chuck 20 through the pressing tool 30 (i.e., the pressing ring 30'). In some embodiments, the chuck 20 and the package body 10 may be moved upward to enable the package body 10 to contact the pressing tool 30 (i.e., the pressing ring 30') and to be pressed and flattened by the pressing tool 30 (i.e., the pressing ring 30') through the second moving device 42 of FIG. 1. As shown in FIG. 21, the periphery of the top surface 11 of the package body 10 may contact the pressing tool 30 (i.e., the pressing ring 30').

Referring to FIG. 22, the pressing tool 30 (i.e., the pressing ring 30') is removed from the package body 10. In some embodiments, as shown in FIG. 22, the chuck 20 and the package body 10 may be moved downward. Then, the stages illustrated in FIG. 17 through FIG. 20 are repeated to form the semiconductor package structure 9 of FIG. 20.

In some embodiments, the stages illustrated in FIG. 21 and FIG. 22 may also be implemented in a curing stage subsequent to the stage illustrated in FIG. 19.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
   providing a package body disposed on a chuck, wherein the package body includes a semiconductor element encapsulated in an encapsulant, wherein the semiconductor element has a backside surface facing the chuck and an active surface opposite to the backside surface, wherein the semiconductor element includes a first conductive bump formed on the active surface and exposed by the encapsulant;
   moving a pressing tool transversely to over the package body, wherein the active surface of the semiconductor element faces the pressing tool; and
   pressing the package body on the chuck through the pressing tool, wherein the pressing tool contacts the first conductive bump during pressing the package body.

2. The method of claim 1, further comprising:
   grinding the first conductive bump and the encapsulant before pressing of the package body.

3. The method of claim 1, wherein the semiconductor element further includes a second conductive bump formed on the active surface and exposed by the encapsulant, wherein the pressing tool does not contact the second conductive bump during pressing the package body.

4. The method of claim 1, further comprising:
   raising a bottom surface of the pressing tool from a first elevation, with respect to the chuck, lower than a top surface of the package body to a second elevation, with respect to the chuck, higher than the top surface of the package body.

5. The method of claim 4, wherein the top surface of the package body includes a first portion of a first elevation and a second portion of a second elevation lower than the first elevation, wherein the step of pressing the package body comprises:
   pressing the first portion of the top surface of the package body.

6. The method of claim 5, wherein the pressing tool does not contact the second portion during pressing the first portion of the top surface of the package body.

7. The method of claim 1, wherein the step of pressing the package body comprises:
   moving the chuck toward the pressing tool to make a top surface of the package body facing away from the chuck contact the pressing tool.

8. The method of claim 1, further comprising:
   creating a negative pressure between the package body and the chuck before the step of pressing the package body is ended; and
   releasing the negative pressure later than removing the pressing tool from the package body.

9. The method of claim 8, further comprising:
   forming the redistribution structure on the package body before the negative pressure is released.

10. The method of claim 1, wherein the step of pressing the package body comprises:
    pressing a top surface of the package body facing away from the chuck to reduce a first distance between the chuck and a first portion of a bottom surface of the package body facing the chuck and spaced apart from the chuck.

11. The method of claim 10, wherein the step of pressing the top surface of the package body comprises:
    reducing a second distance between a second portion of the bottom surface adjacent to the first portion and the chuck, wherein the pressing tool is located outside a vertical projection of the second portion during pressing the top surface of the package body.

12. The method of claim 11, wherein the first distance is greater than the second distance before performing the step of pressing the package body on the chuck through the pressing tool.

13. The method of claim 10, wherein the step of pressing the top surface of the package body comprises:
    making the first portion contact the chuck.

14. The method of claim 13, further comprising:
    creating a negative pressure between the package body and the chuck before the step of pressing the top surface of the package body is ended.

15. The method of claim 14, further comprising:
    forming a redistribution structure on the package body before the negative pressure is released.

16. The method of claim 15, further comprising:
    removing the pressing tool from the package body earlier than the negative pressure is released.

17. The method of claim 1, wherein the backside surface of the semiconductor element is exposed by the encapsulant.

18. The method of claim 17, wherein the step of pressing the package body comprises:
    pressing the encapsulant of the package body to reduce a distance between the backside surface of the semiconductor element and the chuck.

19. The method of claim 18, wherein the step of pressing the encapsulant of the package body comprises:

making the backside surface of the semiconductor element contact the chuck.

* * * * *